United States Patent [19]

Pohl

[11] 3,961,240

[45] June 1, 1976

[54] TESTING ELECTRICAL IGNITION SYSTEMS OF INTERNAL COMBUSTION ENGINES

[75] Inventor: Dieter Pohl, Boll, Germany

[73] Assignee: Robert Bosch G.m.b.H., Stuttgart, Germany

[22] Filed: Aug. 6, 1974

[21] Appl. No.: 495,194

[30] Foreign Application Priority Data

Aug. 31, 1973 Germany ............................ 2343895

[52] U.S. Cl. ............................ 324/16 R; 324/16 T; 324/78 F; 328/148; 328/149

[51] Int. Cl.[2] .................. G01R 13/42; G01R 23/00; G01R 27/00

[58] Field of Search .................. 324/16 R, 16 T, 15, 324/18, 19, 78 F, 78 J, 83 R; 328/147, 148, 149

[56] References Cited

UNITED STATES PATENTS

| | | | |
|---|---|---|---|
| 2,982,887 | 5/1961 | Seeley, Jr. | 328/149 X |
| 3,551,800 | 12/1970 | Widmer | 324/15 |
| 3,569,831 | 3/1971 | Davis | 324/78 F |
| 3,743,922 | 7/1973 | Festos | 324/19 |
| 3,793,584 | 2/1974 | Lai et al. | 324/16 R |
| 3,820,013 | 6/1974 | Trimble et al. | 324/16 R |
| 3,832,628 | 8/1974 | Pottebaum | 324/83 A |

*Primary Examiner*—Saxfield Chatmon, Jr.
*Attorney, Agent, or Firm*—Flynn and Frishauf

[57] ABSTRACT

A signal representative of an ignition pulse is derived, for example by slipping a transducer over an ignition cable, and the signal is passed through a low path filter to form an average value signal, the maximum intensity, or the timing of the maximum intensity of which is analyzed with respect to a threshold level (which may be dynamic, by comparison with other pulses, or fixed) and/or with respect to time of occurrence of the maximum value after the ignition pulse has commenced.

7 Claims, 8 Drawing Figures

TESTING ELECTRICAL IGNITION SYSTEMS OF INTERNAL COMBUSTION ENGINES

The present invention relates to testing of electrical ignition systems for internal combustion engines, and more particularly to test voltage across the spark gap of a spark plug and to analyze the ignition pulse.

Ignition pulses, and ignition events of sparks at spark plugs can be analyzed by means of an oscilloscope. Improperly operating, or faulty components in the ignition system can be identified by analyzing the curve trace observed on the oscilloscope, or by analyzing oscillograms. It is difficult to represent the outputs of oscilloscopes in numerical values. In connection with overall testing of automotive vehicle engines, and with obtaining a print-out of test results, it would be desirable to analyze the ignition voltage amplitude, and time distribution and to be able to represent the analyzed result in digital form. Testing the curve trace, as obtained for example on an oscilloscope, by means of sample-and-hold circuits has the disadvantage that such circuits require a large number of components and are complex, and are further subject to provide wrong results if noise or spurious signals or pulses are sensed thereby. Noise pulses and spurious signals are frequently unavoidable in test apparatus which is connected to automotive vehicles, and which are used in the rough environment of automotive repair stations, where well regulated and noise-free power is usually not available.

It is an object of the present invention to provide a method, and apparatus, to evaluate the curve trace of an ignition pulse, as it appears at the spark plug of an internal combustion engine, and to provide an output in such a manner that it can be digitally evaluated, so that it can be represented by a print-out, for example by a printer which prints test results in accordance with a testing format.

SUBJECT MATTER OF THE PRESENT INVENTION:

Briefly, the signal to be tested is derived from the ignition system, directly or by means of a transducer, and then connected to a low pass filter to form an average value. The thus formed average value is sensed and compared with a reference. The reference may be a certain reference voltage, or may be a dynamic reference derived from previously sensed and stored test results.

In accordance with a feature of the invention, a signal is derived from a transducer coupled to the ignition cable and connected to a low pass filter which, in turn, is connected to an operational amplifier connected as a comparator. Such a circuit is simple, and provides reliable test results without being adversely affected by the rough environment prevalent in service garages.

The invention will be described by way of example with reference to the accompanying drawings, wherein.

Figure 1:
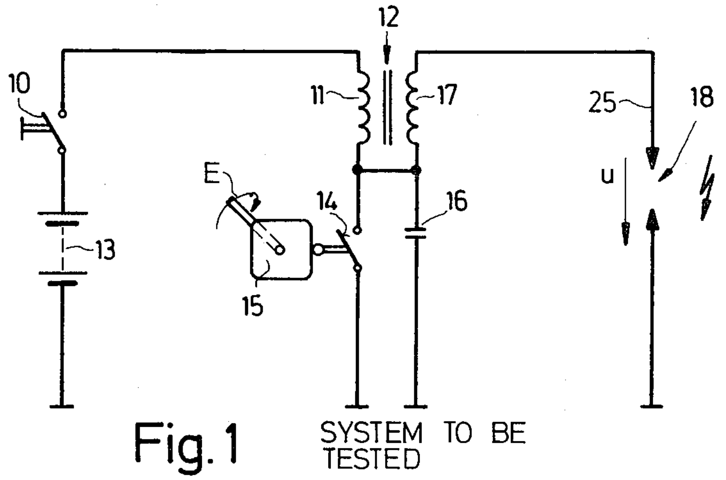
FIG. 1 is a highly schematic representation of a conventional ignition system of the type to be tested.

The system to be tested is schematically illustrated in FIG. 1, where an ignition switch 10, when closed, connects the primary winding 11 of an ignition coil 12 to a battery 13. The primary 11 of the ignition coil or transformer 12 is connected in series with the breaker contacts 14 to an ignition distributor-breaker assembly 15, driving from the internal combustion engine as schematically indicated by drive shaft E. Drive shaft E rotates in synchronism with the rotation of the engine. An ignition capacitor 16 is connected across the breaker contacts; the secondary 17 of the ignition coil is connected by means of an ignition cable 25 to a spark plug, schematically illustrated at 18. A distributor, for a multicylinder internal combustion engine, has been omitted for clarity, but would be connected in series with cable 25 to distribute the spark pluses to various spark plugs.

Operation:

Upon closing of ignition switch 10, and when the breaker contact 14 is likewise closed, current will flow from battery or other voltage source 13 over primary 11 of ignition transformer 12, and over the closed breaker contacts 14. When the breaker contact 14 opens, that is, when the breaker cam 15 reaches a depressed portion (as illustrated in FIG. 1), the current tends to continue to flow and takes the path over the primary coil 11 and the ignition capacitor 16 which, at this instant, is discharged. Ignition capacitor 16 charges. Upon opening of the breaker contact 14, however, the current flow (except for the charge current of capacitor 16) is interrupted and a high voltage pulse is induced in the secondary 17 of the coil 12, which high voltage pulse is transmitted over cable 25 to spark plug 18.

Figure 2:
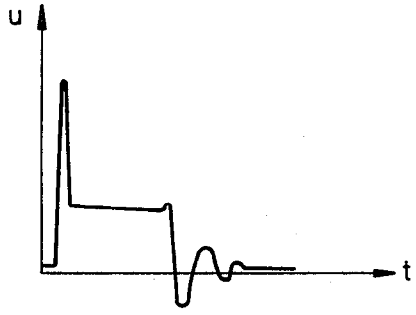
FIGS. 2–5 are voltage (ordinate) versus time diagrams useful in the explanation of the concept of the present invention.

FIG. 2 illustrates the time-voltage diagram for a properly operating ignition system. The voltage $u$ rises suddenly and forms a steep needle pulse. The needle pulse voltage then drops and remains approximately constant or even for some predetermined time. This voltage corresponds to the arcing voltage, the maximum of the needle pulse being the ignition breakdown voltage. When the contact 14 again closes, the voltage drops to null and, after a few minor damped oscillations (due to the inductance and capacitance of the system) the voltage becomes zero.

Figure 3:
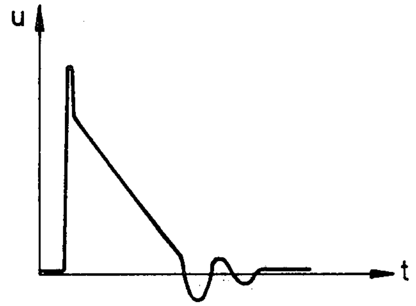

The voltage-time diagram, that is, the function of voltage with respect to time illustrated in FIG. 3 corresponds to one form of improperly operating ignition system. After the needle pulse, the voltage does not drop rapidly to the holding or arcing voltage; rather, the function $u$ $(t)$ shows a much more gradual drop with a lesser slope, down to approximately zero voltage which, when the breaker contact 14 again closes, becomes completely zero, after a few minor damped oscillations.

Figure 4:
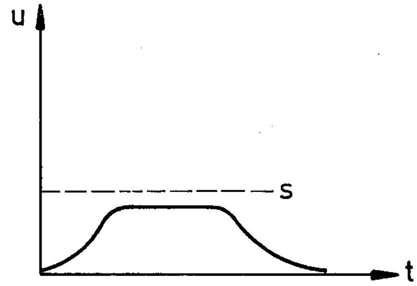
Figure 5:
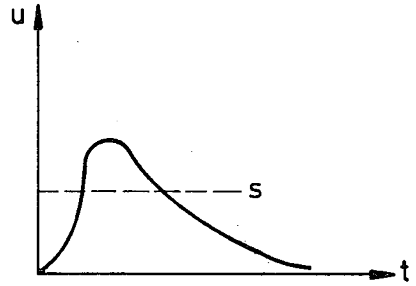

If the voltages of FIGS. 2 and 3 are applied to a low pass filter, then, respectively, the output voltages of FIGS. 4 and 5 will be obtained. FIG. 4 illustrates the output voltage from a low pass filter if the ignition system is operating properly, that is, the output voltage when the ignition voltage corresponds to FIG. 2; FIG. 5 illustrates the output voltage from a low pass filter when the voltage has a time distribution as illustrated, for example, in FIG. 3.

Figure 6:
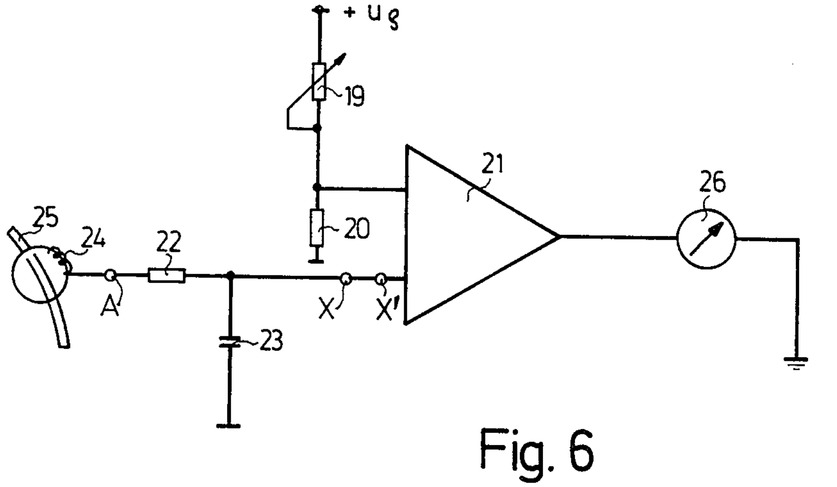
FIG. 6 is a general schematic block diagram of the circuit used in the test apparatus of the present invention.

The amplitude and the occurrence, with respect to time (or either characteristic) of the maximum value of the output voltage from the low pass filter is an indication of the condition of the ignition system. FIG. 6 illustrates an evaluation circuit, in which a comparator is connected to the output voltage. The comparator is an operational amplifier 21, which is set for a certain threshold by having one input, for example the direct input, connected to a voltage divider which, in turn, is connected across a voltage of known value, for example stabilized by means of a breakdown diode, such as a Zener diode, or the like. The threshold level is adjustable by setting the adjustable resistance 19. The input voltage applied to the operational amplifier 21 from the junction between resistors 19, 20 forms a reference value which, in FIGS. 4 and 5 is illustrates by the level shown in the broken line s. The second input, for example the inverting input of operational amplifier 21 is connected to the output of a low pass filter formed of resistor 22 and capacitor 23. A voltage representative of the voltage at the ignition path, or sparks of spark plug 18 is applied to the resistor 22, for example by means of an inductive transducer 24 which is slipped over ignition cable 25. The output of operational amplifier 21 is connected to an indicator 26 which, for example, may be a digital instrument which indicates if the output of the low pass filter 22, 23 is above, or below the threshold value *s*. A corresponding print-out may be obtained from a printer, for example by printing "pass" if the output from low pass filter 22, 23 is below the threshold value *s*, whereas an output above this threshold value causes a print-out of FAILED.

Figure 6A:
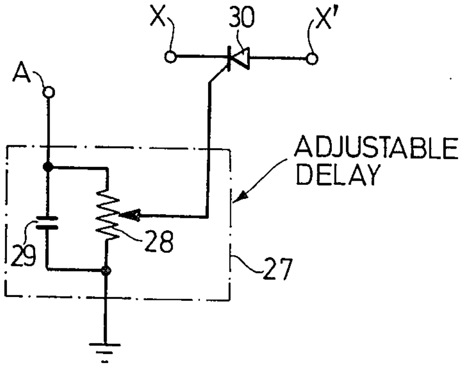
FIG. 6a is a fragmentary diagram illustrating a modification of the circuit of FIG. 6.
Figure 6B:
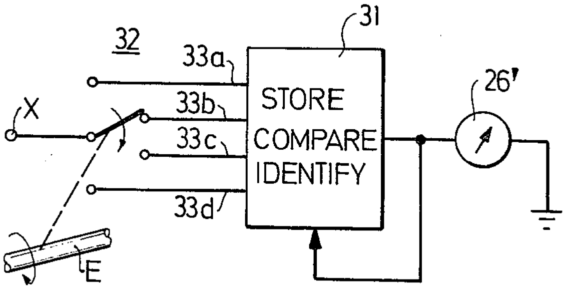
FIG. 6b is a fragmentary schematic circuit illustrating another modification.

The occurrence of the maximum of the average value can also be tested with respect to time. Referring to FIG. 6a, the circuit is broken at terminals X, X′ and a connection is made to terminal A, to derive a signal from the ignition pulse which triggers a timing circuit which, after a predetermined time, connects the output of the low pass filter 22, 23 with the operational amplifier 21. As shown in FIG. *6a*, a thyristor 30 is connected between terminals X, X′, triggered from the output of an adjustable time delay circuit 27 which, in a simple form, may be R/C circuit 28, 29 connected to terminal A. The time delay can be made adjustable, by making one of the elements of the R/C circuit adjustable. Various suitable types of timing circuits may be used. If, after a certain time delay, the output signal of low pass filter 22, 23 is above threshold level s then there is trouble in the ignition system; if, however, at that time, the output signal of low pass filter 22, 23 is below the threshold value *s*, the ignition system may be in order. Thus, if the curve of FIG. 2 is only slightly distorted so that the horizontal portion thereof is only slightly inclined, the ignition system may still function properly although a peak may occur initially which exceeds the threshold level *s*. By including the timing circuit and delaying testing with respect to the reference until after the elapsed time, the indicator 26 would still indicate "pass".

The ignition voltage, or rather, extreme values thereof can be evaluated not only with respect to a fixed reference, as illustrated in FIG. 6; the reference voltage may also be a dynamic reference, that is, if a multicylinder engine is tested, the ignition signals applied to various spark plugs may be compared with each other; or, in a single cylinder engine, subsequently occurring ignition pulses may be compared with each other. Referring to FIG. *6b:* the circuit to the right of terminal X of FIG. 6 is replaced by the circuit of FIG. *6b*. The ignition cable 25, in this case, would be the cable going from the ignition coil to the distributor connection. A signal, which is representative of the voltage at the ignition path is sequentially sampled by a cyclically operating switch 32, applying the pulses derived from the low pass filter 22, 23 to a storage and comparison circuit 31. Such a storage and comparison circuit may, in its simplest form, consist merely of a group of capacitors, each one forming an address for one of the specific incoming lines (illustrated to be used with a four cylinder engine) and providing a voltage to two inputs of a comparator-amplifier, for example an operational amplifier like amplifier 21 (FIG. 6), coupled with a differentiator circuit which discharges the capacitor connected as a reference, after the measurement has been carried out. If the stored values are all roughly the same, the assumption is reasonable that the ignition system is in order. Any substantial deviation of a signal from one, or the average of all the signals leads to the conclusion, however, that the ignition system of the internal combustion engine does not operate properly. An identifying circuit, which identifies the particular cylinder involved (by identifying the time sequence of the signal which is an extreme value with respect to the average, or similar signals), as known, may be incorporated in the circuit, by feeding back the output and comparing the output derived from the circuit 31 with the individual input then connected. The output indication is available at an indicator 26′. In accordance with another modification, the various input lines 33a, 33b, 33c, 33d may all be coupled by transducer similar to transducer 24 to respective spark plug cables, or to the spark plugs themselves and connected, either over separate low pass filters 22, 23 to effect sequential comparison, or to a single low pass filter, by means of decoupling circuits (such as diodes, or selectively triggered electronic switches) for sequential evaluation thereof. The operation of the various separate spark plugs, and ignition circuits may, thereby, be tested selectively, and separately.

The output derived from the circuits 21, 31 is available in ON-OFF form, that is, in digital form, and thus provides reliable information regarding the condition of the ignition system, furnishing measuring results which can be used in combination with computerized testing of internal combustion engines.

Various changes and modifications may be made within the scope of the invention concept and features described in connection with any embodiments may, selectively, be used with any other.

I claim:

1. Method to test electrical ignition of internal combustion engines by checking the voltage pulses across the spark gap of the spark plugs thereof, comprising generating a reference signal;

deriving a signal having a wave shape directly corresponding to the ignition pulse applied to the spark plug;

forming an average value signal of said derived signal by passing the signal representative of the ignition pulse through a low pass filter;

and evaluating an extreme value of a parameter of said average value signal with respect to the reference signal, comprising comparing the maximum amplitude value of said average value signal with the amplitude of said reference signal.

2. Method according to claim 1, wherein the comparison step comprises comparing said amplitudes a predetermined time after the initial occurance of said derived signal.

3. Method according to claim 1 wherein the step of generating the reference signal comprises storing a representation of said average value signal, and the evaluation step comprises comparing said stored representation with the average value signal of a subsequently occurring signal.

4. Test apparatus to test electrical ignition of internal combustion engines comprising means (24) deriving a signal having a wave shape directly corresponding to an ignition pulse applied to the spark plug (18) of the internal combustion engine;

a low pass filter (22, 23) having said derived signal applied thereto and forming an average signal;

comparator means (21) having said average signal applied to one input and a reference signal applied to another input;

output means (26) sensing whether the average signal is above, or below said reference signal;

a timing circuit (27) starting a timing interval upon generation of said ignition pulse;

and switch means (30) connecting the output of said low pass filter with the comparator, controlled by said time circuit, upon lapse of said timing interval.

5. Apparatus according to claim 4 further comprising a time circuit (27) starting a timing interval upon generation of said ignition pulse;

and switch means (30) connecting the output of said low pass filter with the comparator, controlled by said time circuit, upon lapse of said timing interval.

6. Test apparatus to test electrical ignition of internal combustion engines comprising means (24) deriving a signal having a wave shape directly corresponding to an ignition pusle applied to the spark plug (18) of the internal combustion engine;

a low pass filter (22, 23) having said derived signal applied thereto and forming an average signal;

comparator means (21) having said average signal applied to one input and a reference signal applied to another input;

output means (26) sensing whether the average signal is above, or below said reference signal;

and a storage circuit (31) having one address for each cylinder of the internal combustion engine, the reference signal applied to said other input of the comparator means being a signal derived from at least one of said addresses and representative of a prior ignition pulse to compare any one ignition pulse with a prior pulse, or pulses.

7. Apparatus according to claim 6 wherein the comparator means compares an extreme value of the signal applied to said one input with said reference signal.

* * * * *